United States Patent
Tanaka

(10) Patent No.: US 8,698,133 B2
(45) Date of Patent: Apr. 15, 2014

(54) ORGANIC ELECTROLUMINESCENT DEVICE COMPRISING A POLYMER OBTAINED BY POLYMERIZING A POLYMERIZABLE COMPOUND CAPABLE OF EXHIBITING CHARGE TRANSPORTABILITY AND METHOD FOR MANUFACTURING THE SAME

(75) Inventor: Shin-ya Tanaka, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/131,490

(22) PCT Filed: Nov. 26, 2009

(86) PCT No.: PCT/JP2009/070268
§ 371 (c)(1),
(2), (4) Date: Jul. 12, 2011

(87) PCT Pub. No.: WO2010/061962
PCT Pub. Date: Jun. 3, 2010

(65) Prior Publication Data
US 2011/0272678 A1    Nov. 10, 2011

(30) Foreign Application Priority Data
Nov. 28, 2008   (JP) ................................ 2008-303865

(51) Int. Cl.
*H01L 29/08* (2006.01)
*H01L 35/24* (2006.01)
*H01L 51/00* (2006.01)

(52) U.S. Cl.
USPC ............... 257/40; 257/E51.01; 257/E51.012; 257/E51.017; 257/E51.018

(58) Field of Classification Search
USPC ............... 257/40, E51.01, E51.012, E51.017, 257/E51.018
See application file for complete search history.

(56) References Cited

U.S. PATENT DOCUMENTS

| | | | | |
|---|---|---|---|---|
| 5,343,050 | A * | 8/1994 | Egusa et al. | 257/40 |
| 5,518,824 | A * | 5/1996 | Funhoff et al. | 428/690 |
| 6,582,504 | B1 * | 6/2003 | Fujita | 106/311 |
| 6,897,621 | B2 * | 5/2005 | Park | 315/169.3 |
| 7,018,724 | B2 * | 3/2006 | Kambe et al. | 428/690 |
| 7,126,271 | B2 * | 10/2006 | Lee et al. | 313/506 |
| 7,236,845 | B2 * | 6/2007 | Ludwicki et al. | 700/106 |
| 7,238,436 | B2 * | 7/2007 | Hatwar et al. | 428/690 |

(Continued)

FOREIGN PATENT DOCUMENTS

CN    101154717 A    4/2008
FR    2897983 A1 *  8/2007

(Continued)

OTHER PUBLICATIONS

Machine-generated English translation of JP 2008-231419 published Oct. 2, 2008 to Hitachi Chemical Co., Ltd.

(Continued)

*Primary Examiner* — Ida M Soward
(74) *Attorney, Agent, or Firm* — Sughrue Mion, PLLC

(57) ABSTRACT

An organic electroluminescent device includes a pair of electrodes and a plurality of organic layers disposed between the electrodes, and one of the organic layers includes an organic material forming the organic layers and a polymer obtained by polymerizing a polymerizable compound capable of exhibiting charge portability.

9 Claims, 1 Drawing Sheet

(56) References Cited

U.S. PATENT DOCUMENTS

| | | | |
|---|---|---|---|
| 7,399,536 B2* | 7/2008 | Suh | 428/690 |
| 7,528,003 B2* | 5/2009 | Liu | 438/99 |
| 7,544,425 B2* | 6/2009 | Helber et al. | 428/690 |
| 7,629,741 B2* | 12/2009 | Liao et al. | 313/506 |
| 7,777,413 B2* | 8/2010 | Kuma et al. | 313/506 |
| 7,867,630 B2* | 1/2011 | Kim et al. | 428/690 |
| 7,911,133 B2* | 3/2011 | Tyan et al. | 313/506 |
| 7,960,500 B2* | 6/2011 | Park et al. | 528/423 |
| 8,053,093 B2* | 11/2011 | Shin et al. | 428/690 |
| 8,062,766 B2* | 11/2011 | Son et al. | 428/690 |
| 8,124,965 B2* | 2/2012 | Towns et al. | 257/40 |
| 8,441,003 B2* | 5/2013 | Takahashi | 257/40 |
| 2004/0054152 A1 | 3/2004 | Meerholz et al. | |
| 2004/0127666 A1* | 7/2004 | Inbasekaran et al. | 528/8 |
| 2004/0245542 A1* | 12/2004 | Kim | 257/103 |
| 2004/0247934 A1 | 12/2004 | Takeuchi et al. | |
| 2006/0210827 A1* | 9/2006 | Becker et al. | 428/690 |
| 2006/0233950 A1* | 10/2006 | Kim et al. | 427/148 |
| 2007/0085086 A1* | 4/2007 | Gohara et al. | 257/79 |
| 2007/0188084 A1* | 8/2007 | Fukuoka et al. | 313/506 |
| 2008/0054794 A1* | 3/2008 | Hatanaka et al. | 313/504 |
| 2008/0074039 A1 | 3/2008 | Seki et al. | |
| 2008/0129192 A1* | 6/2008 | Watanabe et al. | 313/504 |
| 2008/0286610 A1* | 11/2008 | Deaton et al. | 428/704 |
| 2009/0021147 A1 | 1/2009 | Sugita et al. | |
| 2009/0051271 A1* | 2/2009 | Birnstock et al. | 313/504 |
| 2009/0079345 A1* | 3/2009 | Inuiya | 313/523 |
| 2009/0173372 A1* | 7/2009 | Carroll et al. | 136/244 |
| 2009/0212693 A1* | 8/2009 | Yamada | 313/504 |
| 2009/0302278 A1 | 12/2009 | Uetani | |
| 2010/0096980 A1* | 4/2010 | Nakatani et al. | 313/504 |
| 2010/0108993 A1* | 5/2010 | Moriwaki et al. | 257/40 |
| 2010/0171104 A1* | 7/2010 | Asada | 257/40 |
| 2011/0042696 A1* | 2/2011 | Smith et al. | 257/89 |

FOREIGN PATENT DOCUMENTS

| | | |
|---|---|---|
| JP | 2003-073666 A | 3/2003 |
| JP | 2004-505169 A | 2/2004 |
| JP | 2006-279007 A | 10/2006 |
| JP | 2006-348274 A | 12/2006 |
| JP | 2008-084654 A | 4/2008 |
| JP | 2008-098619 A | 4/2008 |
| JP | 2008-231419 A | 10/2008 |
| JP | 2009-267392 A | 11/2009 |

OTHER PUBLICATIONS

Office Action issued Jun. 12, 2012 in Japanese Patent Application No. 2008-303865 with translation.

Office Action issued Feb. 26, 2013 in Japanese Patent Application No. 2008-202865 with translation.

First Office Action issued Mar. 20, 2013 in Chinese Patent Application No. 200980146973.3 to Sumitomo Chemical Co., Ltd., with English translation.

Chinese Office Action issued in corresponding CN Application No. 200980146973.3, dated Jan. 13, 2014.

* cited by examiner

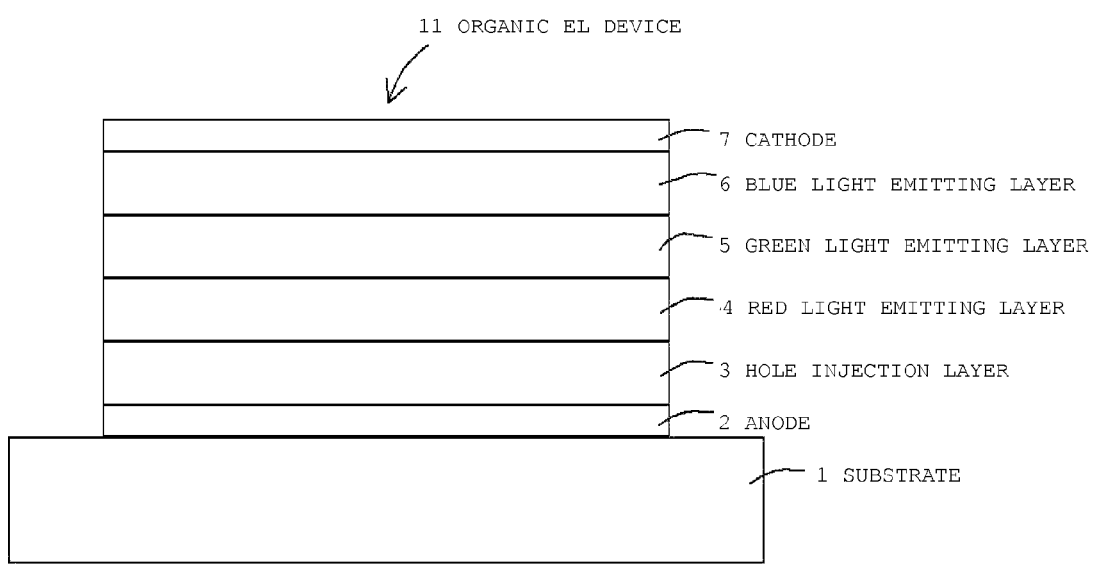

ORGANIC ELECTROLUMINESCENT DEVICE COMPRISING A POLYMER OBTAINED BY POLYMERIZING A POLYMERIZABLE COMPOUND CAPABLE OF EXHIBITING CHARGE TRANSPORTABILITY AND METHOD FOR MANUFACTURING THE SAME

CROSS REFERENCE TO RELATED APPLICATIONS

This application is a National Stage of International Application No. PCT/JP2009/070268 filed Nov. 26, 2009, claiming priority based on Japanese Patent Application No. 2008-303865, filed Nov. 28, 2008, the contents of all of which are incorporated herein by reference in their entirety.

TECHNICAL FIELD

The present invention relates to an organic electroluminescent device (hereinafter occasionally referred to as an organic EL device) and a manufacturing method thereof, a planar light source, a lighting unit, and a display unit.

BACKGROUND ART

As one of devices which emit light by application of a voltage, an organic EL device is known. The organic EL device includes a pair of electrodes and a plurality of organic layers disposed between the electrodes. The organic EL device includes a light emitting layer as one of the organic layers, and emits light by the recombination of a hole and an electron injected by applying a voltage between the electrodes in the light emitting layer.

As a method for forming the organic layer, while there is a plurality of methods such as a vapor deposition method and a coating method, in terms of easiness in steps, the formation of the organic layer by using the coating method is examined. When the organic layer is formed by using the coating method, normally, a solution in which an organic material forming the organic layer is dissolved is firstly coated as a coating liquid to form a coating film, and the coating film is further dried to form the organic layer.

However, the method in which a plurality of organic layers are successively laminated by using the coating method requires the step of coating the coating liquid on an organic layer which is previously formed, and the previously formed organic layer is sometimes eluted into the coating liquid when the coating liquid is coated on the organic layer. As a result, it follows that the film thickness of the previously formed organic layer is reduced, the previously formed organic layer is damaged, or the organic material constituting the previously formed organic layer is mixed into an organic layer to be formed subsequently. Thus, by the method in which the coating liquid is simply coated to successively laminate the plurality of organic layers, it is difficult to manufacture an organic EL device having an intended structure.

In order to solve the above-described problem, there is known a method in which a previously formed organic layer is made insoluble to a coating liquid in advance, and an organic layer is formed on the layer by the coating method. For example, a polymer light emitting material having a crosslinking group such as an oxetanyl group or the like in its molecule is used as a light emitting material, a coating liquid containing the light emitting material is coated to form a coating film, and then a crosslinking reaction is caused to obtain an organic layer which is made insoluble to the coating liquid (see, e.g., JP-T-2004-505169). By using the above-described method, even when the coating liquid is coated on the organic layer, it is possible to prevent the previously formed organic layer from being eluted into the coating liquid and, as the result, it is possible to manufacture an organic EL device having an intended structure.

The above-described light emitting material functioning also as a crosslinking agent needs to have properties required of the crosslinking agent in addition to properties required of the light emitting material. Since the light emitting material functioning also as the crosslinking agent needs to have properties required of both of the crosslinking agent and the light emitting material, the degree of difficulty in the development of the light emitting material functioning also as the crosslinking agent is extremely high when compared with the development of a normal light emitting material without the function as the crosslinking agent. Further, since properties required of an organic material for each of organic layers differ according to the type of the organic layer, it is necessary to individually develop an organic material having properties required of the organic layer and properties required of the crosslinking agent for each of the organic layers, and therefore a load in the development of the material is increased.

To cope with this, there is known a method in which, instead of using one type of an organic material which satisfies the two properties as described above, an organic layer is formed by using a crosslinking agent in addition to an organic material. That is, by using two types of materials including an organic material having properties required of an organic layer and a crosslinking agent having properties required of a crosslinking agent, an insolubilized organic layer can be For example, there is known a method in which, when a light emitting layer is formed, a coating liquid in which a given crosslinking agent is added to a normal light emitting material without the function as the crosslinking agent is used to form an coating film, and the crosslinking agent is further crosslinked to form an insolubilized light emitting layer (see, e.g., JP-A-2006-348274).

Since the crosslinking agent influences properties inherent to an organic material such as the light emitting material or the like, for example, even when the light emitting layer is formed by using the light emitting material having high properties as the light emitting material, by addition of the crosslinking agent, the properties of the light emitting layer are sometimes degraded. In the organic layer formed by using a conventional given crosslinking agent, the influence exerted on the properties of the organic material by the crosslinking agent is significant so that the properties thereof is sharply degraded by the addition of the crosslinking agent. Consequently, an organic EL device having such organic layer does not necessarily have sufficient luminous efficiency. Although the amount of addition of the crosslinking agent can be reduced in order to suppress the influence caused by the addition of the crosslinking agent, the insolubilization of the organic layer becomes insufficient in this case, and it becomes difficult to manufacture the organic EL device having the intended structure, as described above.

Accordingly, an object of the present invention is to provide an organic electroluminescent device and a manufacturing method thereof which allow suppression of a reduction in luminous efficiency resulting from addition of a crosslinking agent, and easy manufacture of a device having an intended structure.

The present invention relates to an organic electroluminescent device comprising a pair of electrodes, and a plurality of organic layers disposed between the electrodes and including an organic light emitting layer, wherein one of the organic layers contains an organic material forming the organic layers and a polymer obtained by polymerizing a polymerizable compound capable of exhibiting charge transportability.

The present invention relates to the organic electroluminescent device, wherein the polymerizable compound is an aromatic compound.

The present invention relates to the organic electroluminescent device, wherein the aromatic compound is a fluorene compound.

The present invention relates to the organic electroluminescent device, wherein the ratio of amount of the polymer obtained by polymerizing the polymerizable compound relative to the total weight of the organic layers is not less than 5% by weight and less than 40% by weight.

The present invention relates to the organic electroluminescent device, wherein the polymerizable compound has at least one group selected from the group consisting of a vinyl group, an ethynyl group, a butenyl group, an acryloyl group, an acryloylamino group, a methacryloyl group, a methacryloylamino group, a vinyloxy group, a vinylamino group, a silanol group, a cyclopropyl group, a cyclobutyl group, an epoxy group, an oxetanyl group, a diketenyl group, an epithio group, a lactonyl group, and a lactamnyl group.

The present invention relates to the organic electroluminescent device, wherein the polymerizable compound is phenyl fluorene acrylate.

The present invention relates to a method for manufacturing an organic electroluminescent device comprising a pair of electrodes and a plurality of organic layers disposed between the electrodes, the method comprising a step of preparing a substrate on which one of the pair of electrode has been formed, an organic layer formation step of forming the plurality of organic layers by using a coating method, and an electrode formation step of forming the other electrode of the pair of electrodes, wherein, in the organic layer formation step, a coating film is formed by the coating method in which is used a coating liquid containing an organic material forming the organic layers and a polymerizable compound capable of exhibiting charge portability, and the organic layers are formed by polymerizing the polymerizable compound.

The present invention relates to the method for manufacturing an organic electroluminescent device, wherein the polymerizable compound is phenyl fluorene acrylate.

The present invention relates to the method for manufacturing an organic electroluminescent device, wherein the weight ratio of the organic material to the polymerizable compound in the coating liquid is from 95:5 to 60:40.

The present invention relates to a planar unit comprising the organic electroluminescent device.

The present invention relates to a lighting unit comprising the organic electroluminescent device.

The present invention relates to a display unit comprising the organic electroluminescent device.

BRIEF DESCRIPTION OF DRAWINGS

FIG. 1 is an elevational view schematically showing an organic EL device 11 of one embodiment of the present invention.

EXPLANATION OF REFERENCE 1 substrate
2 anode
3 hole injection layer
4 red light emitting layer
5 green light emitting layer
6 blue light emitting layer
7 cathode
11 organic EL device

MODE FOR CARRYING OUT THE INVENTION

An organic EL device of the present invention includes a pair of electrodes and a plurality of organic layers disposed between the pair of electrodes. In the organic EL device of the present invention, among the plurality of organic layers, an organic layer having a surface on which an organic layer formed by a coating method is provided contains an organic material forming the organic layer and a polymer obtained by polymerizing a polymerizable compound capable of exhibiting charge transportability. In the present description, the organic layer denotes a layer containing an organic substance. The organic layer contains a low molecular weight compound and/or a high molecular weight compound, and may further contain an inorganic substance on an as needed basis.

FIG. 1 is an elevational view schematically showing an organic EL device 11 of one embodiment of the present invention. Hereinbelow, a description will be given of examples of the organic EL device of the present invention and a manufacturing method thereof through the description of the organic EL device having a structure shown in FIG. 1.

The organic EL device includes at least one light emitting layer as the organic layer described above. The organic EL device may include a plurality of light emitting layers, and may further include an organic layer different from the light emitting layer. For example, between the light emitting layer and an anode, there are provided a hole injection layer, a hole transport layer, and an electron blocking layer and, between the light emitting layer and a cathode, there are provided an electron injection layer, an electron transport layer, and a hole blocking layer.

The organic EL device 11 is normally provided on a substrate 1. The organic EL device 11 of the present embodiment is constituted such that an anode 2, a hole injection layer 3, a light emitting layer 4 which emits red light, a light emitting layer 5 which emits green light, a light emitting layer 6 which emits blue light, and a cathode 7 are laminated in this order from the side of the substrate 1. Hereinafter, the light emitting layer 4 which emits red light is referred to as a red light emitting layer 4, the light emitting layer 5 which emits green light is referred to as a green light emitting layer 5, the light emitting layer 6 which emits blue light is referred to as a blue light emitting layer 6, and these three layers are occasionally referred to as the light emitting layers 4, 5, and 6 collectively. In the organic EL device having the structure including a plurality of light emitting layers, a given layer may be disposed between the light emitting layers.

Hereinbelow, a manufacturing method of the organic EL device 11 will be described. The organic EL device 11 of the present embodiment can be formed by laminating the anode 2, the hole injection layer 3, the red light emitting layer 4, the green light emitting layer 5, the blue light emitting layer 6, and the cathode 7 sequentially in this order from the substrate 1.

In the present embodiment, the hole injection layer 3, the red light emitting layer 4, the green light emitting layer 5, and the blue light emitting layer 6 correspond to the organic layers. Among the plurality of these organic layers, an organic layer containing an organic material which is soluble in a coating liquid used in the step of forming another organic layer on the surface thereof is insolubilized in advance to the coating liquid coated on the surface thereof, and contains an organic material forming the organic layer and a polymer obtained by polymerizing a polymerizable compound capable of exhibiting charge transportability. In the present embodiment, each of the red light emitting layer 4 and the green light emitting layer 5 contains the organic material forming the organic layer (a light emitting material emitting red light or a light emitting material emitting green light), and the polymer obtained by polymerizing the polymerizable compound capable of exhibiting charge transportability. Each of the organic layers of the hole injection layer 3, the red light emitting layer 4, the green light emitting layer 5, and the blue light emitting layer 6 may also contain the organic material forming the organic layer and the polymer obtained by polymerizing the polymerizable compound capable of exhibiting charge transportability.

First, a substrate formed with one of a pair of electrodes is prepared. In this step, the substrate formed with one of the electrodes may be prepared by purchasing it in the market, or may be prepared by forming one electrode on the substrate. In the present embodiment, the anode 2 is formed as one of the electrodes.

Next, the hole injection layer 3 is formed on the anode 2. The hole injection layer 3 is formed by forming a coating film by a given coating method using a coating liquid containing an organic material forming the hole injection layer 3 and a solvent which dissolves the organic material, and further removing the solvent.

Examples of the coating method include a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, and an inkjet printing method, and the coating method can be appropriately selected in accordance with the structure of the organic EL device.

An example of the method for removing the solvent includes a method in which the solvent is held at room temperature or under heating in a given atmosphere such as an air atmosphere, a vacuum atmosphere, or an inert gas atmosphere such as nitrogen.

The organic layer, which is formed of the organic material which exhibits insolubility to the coating liquid used in the step of forming another organic layer on the surface thereof, does not need the polymerizable compound for insolubilization, and the organic material constituting the hole injection layer 3 of the present embodiment exhibits insolubility to the coating liquid used at the time of formation of the red light emitting layer 4 provided on the surface of the hole injection layer 3 in the first place so that the hole injection layer 3 of the present embodiment dose not contain the polymerizable compound.

Subsequently, the red light emitting layer 4 is formed. The red light emitting layer 4 contains a light emitting material emitting red light which corresponds to the organic material, and the polymer obtained by polymerizing the polymerizable compound capable of exhibiting charge transportability.

The red light emitting layer 4 is formed by using a solution containing the light emitting material emitting red light, the polymerizable compound capable of exhibiting charge transportability, and a solvent dissolving them as a coating liquid, forming a coating film by a given coating method using the coating liquid, and further polymerizing the polymerizable compound.

The polymerizable compound capable of exhibiting charge transportability denotes a polymerizable compound which exhibits charge transportability before being polymerized, and is a material added to the coating liquid which is different from the material mainly constituting organic layers having given functions such as the hole injection layer, the hole transport layer, the electron blocking layer, the light emitting layer, the electron injection layer, the electron transport layer, and the hole blocking layer. "A material capable of exhibiting charge transportability" in the present description denotes a material which has a charge mobility of a thin film, which is formed only of the material, of not less than $10^{-9}$ $cm^2/V·s$. That is, "the polymerizable compound capable of exhibiting charge transportability" is a polymerizable compound which has a charge mobility of a thin film, which is formed only of the polymerizable compound, of not less than $10^{-9}$ $cm^2/V·S$. The polymerizable compound capable of exhibiting charge transportability has a charge mobility of the thin film of preferably not less than $10^{-9}$ $cm^2/V·s$, and more preferably not less than $10^{-7}$ $cm^2/V·s$ when the thin film is formed thereof.

Such polymerizable compound is preferably an aromatic compound. The aromatic compound may also be a heterocyclic aromatic compound.

Examples of the aromatic compound include an amine compound, a fluorene compound, and a phenylene compound and, among them, the fluorene compound is preferable.

The polymerizable compound has one or a plurality of groups contributing to polymerization (hereinafter occasionally referred to as a polymerization group), and preferably has at least one polymerization group selected from the group consisting of a vinyl group, an ethynyl group, a butenyl group, an acryloyl group, an acryloylamino group, a methacryloyl group, a methacryloylamino group, a vinyloxy group, a vinylamino group, a silanol group, a cyclopropyl group, a cyclobutyl group, an epoxy group, an oxetanyl group, a diketenyl group, an epithio group, a lactonyl group, and a lactamnyl group. Among these polymerization groups, the acryloyl group and the methacryloyl group are preferable. The oxetanyl group denotes a residue obtained by removing one hydrogen atom from oxetane, the diketenyl group denotes a residue obtained by removing one hydrogen atom from diketene, the epithio group denotes a residue obtained by removing one hydrogen atom from episulfide, the lactonyl group denotes a residue obtained by removing one hydrogen atom from lactone, and the lactamnyl group denotes a residue obtained by removing one hydrogen atom from lactam.

Examples of the polymerizable compound include a derivative of PDA (N,N'-tetraphenyl-1,4-phenylenediamine) having the polymerization group, a derivative of TPD (N,N'-bis(3-methylphenyl)-N,N'-bis(phenyl)-benzidine) having the polymerization group, a derivative of NPD (N,N'-bis(naphthalene-1-yl)-N,N'-bis(phenyl)-benzidine) having the polymerization group, triphenyl amine acrylate (triphenyl amine substituted with the acryloyl group), triphenylene diamine acrylate (triphenylene diamine substituted with the acryloyl group), and phenylene acrylate (benzene substituted with the acryloyl group). Among them, phenyl fluorene acrylate (phenyl fluorene substituted with the acryloyl group) is preferable, and 9,9-diphenyl fluorene substituted with acryloyl group is more preferable.

Specifically, bis(phenoxy-ethanol)fluorene diacrylate is preferable, and, more specifically, a compound 1 shown below is given as an example.

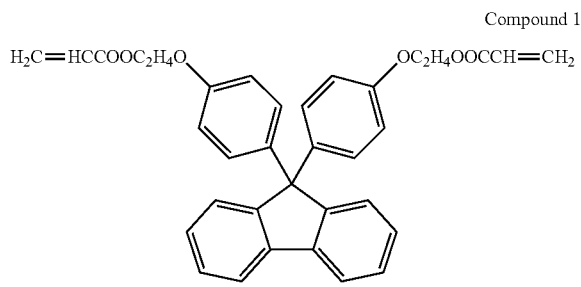

Compound 1

When the proportion of the polymer obtained by polymerizing the polymerizable compound relative to the total weight of the organic layer is extremely high, the influence resulting from the addition of the polymerizable compound becomes outstanding in the properties of the organic layer, and the properties inherent to the organic material tends to be degraded, while when the proportion thereof is extremely low, the insolubilization of the organic layer tends to be insufficient. Accordingly, the proportion thereof is preferably not less than 5% by weight and less than 40% by weight, and more preferably not less than 10% by weight and less than 30% by weight. In order to achieve the above-mentioned proportion of the polymer obtained by polymerizing the polymerizable compound in the organic layer, in the coating liquid, the weight ratio between the organic material and the polymerizable compound is preferably 95:5 to 60:40, and more preferably 90:10 to 70:30.

The coating film is formed using the coating liquid containing the polymerizable compound described above by the coating methods shown as examples at the time of formation of the hole injection layer, and then the polymerizable compound is polymerized.

Examples of the method for polymerizing the polymerizable compound include a method in which heating is performed, and a method in which irradiation of ultraviolet rays is performed. When the polymerization is performed by heating, it is appropriate for the heating temperature to be lower than a heating temperature at which the organic material is changed and its properties are thereby degraded, and the range thereof is, e.g., 50° C. to 300° C., preferably 100° C. to 250° C., and more preferably 130° to 200° C.

When insolubilization is performed by heating, as a thermal polymerization initiator which can be used in combination, those known as radical polymerization initiators can be used in general, and examples thereof include azo compounds such as 2,2'-azobisisobutyronitrile, 2,2'-azobis-(2,4-dimethylvaleronitrile), and 2,2'-azobis(4-methoxy-2,4-dimethylvaleronitrile); organic peroxides such as benzoyl peroxide, lauroyl peroxide, t-butyl peroxypivalate, and 1,1'-bis(t-butyl peroxy)cyclohexane; and hydrogen peroxide.

When the peroxide is used as the radical polymerization initiator, the peroxide may be used together with a reducing agent to be used as a redox type initiator. These thermal polymerization initiators can be used singly or in combination of two or more thereof. The range of a reaction temperature in the case where the thermal polymerization initiator is used in combination is, e.g., 40° C. to 250° C., and preferably 50° C. to 200° C. In the case of photopolymerization using a photopolymerization initiator, the irradiation of ultraviolet rays may appropriately be performed at an irradiation intensity of not less than 0.01 mW/cm$^2$ for 1 second to 3600 seconds, and preferably for 30 seconds to 600 seconds.

Examples of the photopolymerization initiator include an active radical generator which generates an active radical by irradiation of light, and an acid generator which generates an acid thereby. Examples of the active radical generator include an acetophenone-based photopolymerization initiator, a benzoin-based photopolymerization initiator, a benzophenone-based photopolymerization initiator, a thioxanthone-based photopolymerization initiator, and a triazine-based photopolymerization initiator. These photopolymerization initiators can be used singly or in combination of two or more thereof.

By polymerizing the polymerizable compound in the manner described above, the red light emitting layer 4 can be insolubilized to the coating liquid used at the time of formation of the green light emitting layer 5.

Next, the green light emitting layer 5 is formed by using the coating method. The method for forming the green light emitting layer 5 is substantially the same as the method for forming the red light emitting layer 4. Specifically, the green light emitting layer 5 can be formed in the same manner as in the method for forming the red light emitting layer 4 except that a light emitting material emitting green light is used as the organic material instead of the light emitting material emitting red light used as the organic material at the time of formation of the red light emitting layer 4.

In the step of forming the green light emitting layer 5, although the coating liquid is coated on the red light emitting layer 4, since the previously formed red light emitting layer 4 is insolubilized to the coating liquid in advance, the elution of the red light emitting layer 4 into the coating liquid can be prevented.

Subsequently, the blue light emitting layer 6 is formed by the coating method. In the present embodiment, since the cathode 7 is formed on the blue light emitting layer 6 by a dry method, there is no step of coating the coating liquid on the blue light emitting layer 6 after the formation of the blue light emitting layer 6. Consequently, the blue light emitting layer 6 does not need to be insolubilized to the coating liquid, and the blue light emitting layer 6 does not contain the polymerizable compound in the present embodiment.

That is, in the present embodiment, the blue light emitting layer 6 can be formed by using a solution containing a light emitting material emitting blue light and a solvent dissolving the light emitting material as the coating liquid, forming the coating film by the above-described given method, and further removing the solvent. In the step of forming the blue light emitting layer 6, although the coating liquid is coated on the green light emitting layer 5, since the previously formed green light emitting layer 5 is insolubilized to the coating liquid in advance, the elution of the green light emitting layer 5 into the coating liquid can be prevented. Although the blue light emitting layer 6 does not need to be insolubilized, the blue light emitting layer 6 containing the above-described polymerizable compound capable of exhibiting charge transportability may also be constituted.

Next, the cathode 7 is formed. By the steps described above, the organic EL device can be manufactured.

As has been described above, since the red light emitting layer 4 and the green light emitting layer 5 are insolubilized, when the organic layers are formed on these layers by using the coating method, the elution of the red light emitting layer 4 and the green light emitting layer 5 can be prevented. This allows easy manufacture of the organic EL device having the intended structure by the coating method having easy manufacturing steps.

As described above, since the crosslinking agent influences the properties of the organic material, the addition of the crosslinking agent leads to the degradation in the properties of each organic layer. In the organic EL device, a voltage is applied between a pair of electrodes and a current is injected to cause the light emitting layers to emit light so that each layer constituting the organic EL device needs to have a property that allows a current to flow therethrough. As a result, as the organic material forming each organic layer, a material which efficiently transports a charge is usually used. However, when the crosslinking agent capable of exhibiting charge transportability is added to the organic layer having such electric property, it is assumed that the addition of the crosslinking agent significantly influences the properties of the organic layer due to the charge transportability of the crosslinking agent, and the properties of the organic layer are significantly degraded as the result. However, when compared with the crosslinking agent that does not exhibit the charge transportability, it has been found that the influence exerted on the properties by the polymerizable compound capable of exhibiting the charge transportability is actually small, and the degradation in the properties of the organic layer at the time of addition of the polymerizable compound capable of exhibiting the charge transportability can be suppressed.

In the present embodiment, by forming the organic layer using the polymerizable compound capable of exhibiting the charge transportability, the elution of the organic layer into the coating liquid can be prevented, and the degradation in the properties of the organic layer can be suppressed so that the organic layer having the intended film thickness and composition can be formed. Thus, by forming the organic layer using the polymerizable compound capable of exhibiting the charge transportability, not only the organic EL device having the intended structure can be manufactured, but also the organic EL device having high luminous efficiency can be manufactured.

By increasing the amount of the polymerizable compound to be added, the organic layer can be sufficiently insolubilized to the coating liquid so that the elution of the organic layer at the time of coating of the coating liquid can be sufficiently prevented. On the other hand, when the amount of the additive is increased, the properties of the organic layer are significantly degraded so that the amount of addition of the polymerizable compound has been conventionally suppressed. However, since the influence exerted on the properties of the organic layer is small in the case of the polymerizable compound capable of exhibiting the charge transportability, the amount of the polymerizable compound can be increased to be larger than the conventional amount. In the present embodiment, by forming the organic layer using the polymerizable compound capable of exhibiting the charge transportability, even when the proportion of the polymerizable compound is in the preferable range described above, the reduction in luminous efficiency can be suppressed, and the organic EL device having the intended structure can be easily manufactured.

Although the organic EL device 11 having the given layer structure shown in FIG. 1 has been described thus far, the layer structure of the organic EL device is not limited to the layer structure shown in FIG. 1, and the organic EL device may additionally have given layers, as described above.

Hereinbelow, a detailed description will be given of examples of the layer structure of the organic EL device to which the present invention is applicable, a structure of each layer, and a manufacturing method thereof.

Examples of a layer provided between the cathode and the light emitting layer include the electron injection layer, the electron transport layer, and the hole blocking layer. When only one layer is provided between the cathode and the light emitting layer, the layer is referred to as the electron injection layer. When both of the electron injection layer and the electron transport layer are provided between the cathode and the light emitting layer, a layer in contact with the cathode is referred to as the electron injection layer, while a layer other than the electron injection layer is referred to as the electron transport layer.

The electron transport layer is a layer having the function of improving electron injection efficiency from the cathode. The electron transport layer is a layer having the function of improving electron injection from the anode, the electron injection layer, or the electron transport layer closer to the cathode. The hole blocking layer is a layer having the function of blocking the transport of holes. When the electron injection layer and/or the electron transport layer has the function of blocking the transport of holes, there are cases where these layers also function as the hole blocking layer.

With regard to whether or not the hole blocking layer has the function of blocking the transport of holes, the blocking effect can be ascertained by, e.g., fabricating a device which allows only a hole current to flow, and examining a reduction in current value.

Examples of a layer provided between the anode and the light emitting layer include the hole injection layer, the hole transport layer, and the electron blocking layer. When only one layer is provided between the anode and the light emitting layer, the layer is referred to as the hole injection layer. When both of the hole injection layer and the hole transport layer are provided between the anode and the light emitting layer, a layer in contact with the anode is referred to as the hole injection layer, while a layer other than the hole injection layer is referred to as the hole transport layer.

The hole injection layer is a layer having the function of improving hole injection efficiency from the anode. The hole transport layer is a layer having the function of improving hole injection from the anode, the hole injection layer, or the hole transport layer closer to the anode. The electron blocking layer is a layer having the function of blocking the transport of electrons. When the hole injection layer and/or the hole transport layer has the function of blocking the transport of electrons, there are cases where these layers also function as the electron blocking layer.

With regard to whether or not the electron blocking layer has the function of blocking the transport of electrons, the blocking effect can be ascertained by, e.g., fabricating a device which allows only an electron current to flow, and examining a reduction in current value.

The electron injection layer and the hole injection layer are occasionally referred to as a charge injection layer collectively, while the electron transport layer and the hole transport layer are occasionally referred to as a charge transport layer collectively.

Examples of the layer structure which can be employed in the organic EL device of the present invention are shown below.

a) anode/hole injection layer/light emitting layer/cathode
b) anode/hole injection layer/light emitting layer/electron injection layer/cathode
c) anode/hole injection layer/light emitting layer/electron transport layer/cathode
e) anode/hole injection layer/light emitting layer/electron transport layer/electron injection layer/cathode
f) anode/hole transport layer/light emitting layer/cathode d) anode/hole transport layer/light emitting layer/electron injection layer/cathode
e) anode/hole transport layer/light emitting layer/electron transport layer/cathode
f) anode/hole transport layer/light emitting layer/electron transport layer/electron injection layer/cathode
g) anode/hole injection layer/hole transport layer/light emitting layer/cathode
h) anode/hole injection layer/hole transport layer/light emitting layer/electron injection layer/cathode
i) anode/hole injection layer/hole transport layer/light emitting layer/electron transport layer/cathode
j) anode/hole injection layer/hole transport layer/light emitting layer/electron transport layer/electron injection layer/cathode
k) anode/light emitting layer/electron transport layer/cathode
l) anode/light emitting layer/electron transport layer/electron injection layer/cathode (wherein a symbol "/" denotes that layers sandwiching the symbol "/" are laminated to be adjacent to each other. The same shall apply to the symbol "/" shown below.)

Each of the structural examples a) to l) shows the organic EL device having one light emitting layer. However, as in the above-described embodiment, an organic EL device having a plurality of light emitting layers may also be constituted, an organic EL device having the plurality of light emitting layers in which a given layer is provided between the light emitting layers may further be constituted, and what is called a multi-photon type organic EL device in which organic EL devices are laminated in multiple layers may also be constituted.

When the organic EL device is provided on a substrate, the anode is normally disposed on the side of the substrate, but the cathode may also be disposed on the side of the substrate. When the organic EL device is provided on the substrate, by employing an electrode exhibiting light permeability as one of the pair of electrodes, it is possible to realize a top-emission type organic EL device or a bottom-emission type organic EL device.

The order of layers to be laminated, the number of layers, and the thickness of each layer can be appropriately set in consideration of luminous efficiency and device life.

<Substrate>

A substrate which is not changed in process of manufacturing the organic EL device is suitably used and, for example, glass, plastic, and silicon substrates, and substrates obtained by laminating these are used. As the substrate, a commercially available substrate can be used, and the substrate can be manufactured by a known method. Further, there may be used a substrate with a circuit in which a drive circuit for driving the organic EL device is formed such as, e.g., a TFT (Thin Film Transistor) substrate or the like.

<Anode>

In the case of an organic EL device having the configuration in which light from the light emitting layer is extracted through the anode, an electrode exhibiting light permeability is used as the anode. As such electrode, thin films made of a metal oxide, a metal sulfide, and a metal which exhibit high electric conductivity can be used, and films having high light permeability are suitably used. Specifically, thin films made of indium oxide, zinc oxide, tin oxide, ITO, indium zinc oxide (abbreviation: IZO), gold, platinum, silver, and copper are used and, among them, a thin film made of ITO, IZO, or tin oxide is suitably used. Examples of a method for manufacturing the anode include a vacuum vapor deposition method, a sputtering method, an ion plating method, and a plating method. As the anode, organic transparent conductive films made of polyaniline or its derivative, and polythiophene or its derivative may also be used.

A material reflecting light may be used for the anode, and a metal, a metal oxide, and a metal sulfide which have a work function of not less than 3.0 eV are preferable as the material.

The film thickness of the anode can be appropriately selected in consideration of the light permeability and the electric conductivity, and the range thereof is, e.g., 10 nm to 10 μm, preferably 20 nm to 1 μm, and more preferably 50 nm to 500 nm.

<Hole Injection Layer>

Examples of a hole injection material constituting the hole injection layer include oxides such as vanadium oxide, molybdenum oxide, ruthenium oxide, and aluminum oxide, a phenylamine-based material, a starburst type amine-based material, a phthalocyanine-based material, amorphous carbon, polyaniline, and a polythiophene derivative.

An example of a film forming method of the hole injection layer includes film formation from a solution containing the hole injection material. A solvent used in the film formation from the solution is not particularly limited as long as the solvent dissolves the hole injection material, and examples thereof include chlorine-based solvents such as chloroform, methylene chloride, and dichloroethane, ether-based solvents such as tetrahydrofuran and the like, aromatic hydrocarbon-based solvents such as toluene and xylene, ketone-based solvents such as acetone and methyl ethyl ketone, ester-based solvents such as ethyl acetate, butyl acetate, and ethyl cellosolve acetate, and water.

As the film forming method from the solution, the above-described coating methods can be used.

The optimum value of the film thickness of the hole injection layer differs according to the material to be used, the film thickness is appropriately set such that a drive voltage and luminous efficiency take proper values, the film thickness which at least prevents the occurrence of a pinhole is required, and, when the film thickness is extremely large, the drive voltage of the device is increased so that the extremely large film thickness is not preferable. Consequently, the range of the film thickness of the hole injection layer is, e.g., 1 nm to 1 μm, preferably 2 nm to 500 nm, and more preferably 5 nm to 200 nm.

<Hole Transport Layer>

Examples of a hole transport material constituting the hole transport layer include polyvinylcarbazole or its derivative, polysilane or its derivative, a polysiloxane derivative having an aromatic amine on the side chain or main chain, a pyrazoline derivative, an arylamine derivative, a stilbene derivative, a triphenyldiamine derivative, polyaniline or its derivative, polythiophene or its derivative, polyarylamine or its derivative, polypyrrole or its derivative, poly(p-phenylenevinylene) or its derivative, and poly(2,5-thienylenevinylene) or its derivative.

Among these materials, preferable as the hole transport material are high molecular weight hole transport materials such as polyvinylcarbazole or its derivative, polysilane or its derivative, the polysiloxane derivative having an aromatic amine compound group on the side chain or main chain, polyaniline or its derivative, polythiophene or its derivative, polyarylamine or its derivative, poly(p-phenylenevinylene) or its derivative, and poly(2,5-thienylenevinylene) or its derivative, and more preferable are polyvinylcarbazole or its derivative, polysilane or its derivative, and the polysiloxane derivative having an aromatic amine on the side chain or main chain. In the case of a low molecular weight hole transport material, the material is preferably dispersed in a polymer binder in use.

A film forming method of the hole transport layer is not particularly limited. In the case of the low molecular weight hole transport material, an example of the method includes film formation from a mixed solution containing the polymer binder and the hole transport material and, in the case of the high molecular weight hole transport material, an example of the method includes film formation from a solution containing the hole transport material.

As a solvent used in the film formation from a solution is not particularly limited as long as the solvent dissolves the hole transport material, and examples thereof include the above-described solvents dissolving the hole injection material.

Examples of the film forming method from the solution include the same coating methods as the film forming methods of the hole injection layer described above.

As the polymer binder to be mixed, those which do not extremely inhibit charge transport are preferable, those whose absorption to visible light is not strong are suitably used, and examples of the polymer binder include polycarbonate, polyacrylate, polymethyl acrylate, polymethyl methacrylate, polystyrene, polyvinyl chloride, and polysiloxane.

The optimum value of the film thickness of the hole transport layer differs according to the material to be used, the film thickness is appropriately set such that the drive voltage and the luminous efficiency take proper values, the film thickness which at least prevents the occurrence of the pinhole is required and, when the film thickness is extremely large, the drive voltage of the device is increased so that the extremely large film thickness is not preferable. Consequently, the range of the film thickness of the hole transport layer is, e.g., 1 nm to 1 µm, preferably 2 nm to 500 nm, and more preferably 5 nm to 200 nm.

<Light Emitting Layer>

The light emitting layer is normally formed mainly of an organic substance emitting fluorescence and/or phosphorescence, or the organic substance and a dopant assisting the organic substance. The dopant is added in order to, e.g., improve luminous efficiency and change luminous wavelength. The organic substance may be a low molecular weight compound or a high molecular weight compound, and the light emitting layer preferably contains a high molecular weight compound having a polystyrene-equivalent number average molecular weight of $10^3$ to $10^8$. Examples of a light emitting material constituting the light emitting layer include the following dye-based materials, metal complex-based materials, polymer-based materials, and dopant materials.

Examples of the dye-based light emitting material include polymeric materials of a cyclopentamine derivative, a tetraphenylbutadiene derivative compound, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a perynone derivative, a perylene derivative, an oligothiophene derivative, an oxadiazole dimer, a quinacridone derivative, a coumarin derivative, and a pyrazoline dimer.

Examples of the metal complex-based light emitting material include polymeric materials of metal complexes having a rare earth metal such as Tb, Eu, or Dy, Al, Zn, Be, or Ir as a center metal, and having oxadiazole, thiadiazole, phenylpyridine, phenylbenzimidazole, or a quinoline structure as a ligand, and examples of polymeric materials of the metal complexes include a metal complex capable of light emission from a triplet excited state such as an iridium complex or a platinum complex, an alumiquinolinol complex, a benzoquinolinol beryllium complex, a benzoxazolyl zinc complex, a benzothiazole zinc complex, an azomethyl zinc complex, a porphyrin zinc complex, and a phenanthroline europium complex.

Examples of the polymer-based light emitting material include a polyparaphenylenevinylene derivative, a polythiophene derivative, a polyparaphenylene derivative, a polysilane derivative, a polyacetylene derivative, a polyfluorene derivative, and a polyvinylcarbazole derivative.

Among the light emitting materials described above, examples of a light emitting material mainly constituting the red light emitting layer include the coumarin derivative, the thiophene ring derivative, and their polymers, the polyparaphenylenevinylene derivative, the polythiophene derivative, and the polyfluorene derivative. Among them, the polyparaphenylenevinylene derivative, the polythiophene derivative, and the polyfluorene derivative as polymer materials are preferable.

Among the light emitting materials described above, examples of a light emitting material mainly constituting the green light emitting layer include the quinacridone derivative, the coumarin derivative, the thiophene ring compound, and their polymers, the polyparaphenylenevinylene derivative, and the polyfluorene derivative. Among them, the polyparaphenylenevinylene derivative and the polyfluorene derivative as polymer materials are preferable.

Among the light emitting materials described above, examples of a material mainly constituting the blue light emitting layer include the distyrylarylene derivative and/or the polymer of the oxadiazole derivative, the polyvinylcarbazole derivative, the polyparaphenylene derivative, and the polyfluorene derivative. Among them, the polyvinylcarbazole derivative, the polyparaphenylene derivative, and the polyfluorene derivative as polymer materials are preferable.

The light emitting materials mainly constituting the individual light emitting layers may further include dopant materials for the purpose of, e.g., improving the luminous efficiency and change the luminous wavelength in addition to the above-described light emitting materials. Examples of such dopant materials include the perylene derivative, the coumarin derivative, a rubrene derivative, the quinacridone derivative, a squalium derivative, a porphyrin derivative, a styryl-based dye, a tetracene derivative, a pyrazolone derivative, decacyclene, and phenoxazone.

As a film forming method of the light emitting layers, a method in which a solution containing the light emitting material is coated, the vacuum vapor deposition method, and a transfer method can be used. Examples of a solvent used in the film formation from the solution include those described as the solvents dissolving the hole injection material described above. When the light emitting layer is formed by using the coating method, the light emitting layer can be formed by the same methods as those described above.

The film thickness of the light emitting layer is appropriately set according to the type thereof, and the range of the film thickness is normally 2 to 500 and preferably 5 to 200.

<Electron Transport Layer>

As an electron transport material constituting the electron transport layer, known materials can be used, and examples of the material include the oxadiazole derivative, anthraquinodimethane or its derivative, benzoquinone or its derivative, naphthoquinone or its derivative, anthraquinone or its derivative, tetracyanoanthraquinodimethane or its derivative, a fluorenone derivative, diphenyldicyanoethylene or its derivative, a diphenoquinone derivative, 8-hydroxyquinoline or a metal complex of its derivative, polyquinoline or its derivative, polyquinoxaline or its derivative, and polyfluorene or its derivative.

Among them, preferable as the electron transport material are the oxadiazole derivative, benzoquinone or its derivative, anthraquinone or its derivative, 8-hydroxyquinoline or the metal complex of its derivative, polyquinoline or its derivative, polyquinoxaline or its derivative, and polyfluorene or its derivative, and more preferable are 2-(4-biphenylyl)-5-(4-t-butylphenyl)-1,3,4-oxadiazole, benzoquinone, anthraquinone, tris(8-quinolinol)aluminum, and polyquinoline.

A film forming method of the electron transport layer is not particularly limited. In the case of a low molecular weight electron transport material, examples of the film forming method include a vacuum vapor deposition method from powder, or film formation from a solution or a molten state and, in the case of a high molecular weight electron transport material, an example thereof includes film formation from a solution or a molten state. When the film formation from a solution or a molten state is performed, a polymer binder may be used in combination. Examples of the film forming method for forming the electron transport layer from the solution include the same film forming methods as the methods for forming the hole injection layer from the solution described above.

The optimum value of the film thickness of the electron transport layer differs according to the material to be used, the film thickness is appropriately set such that the drive voltage and the luminous efficiency take proper values, the film thickness which at least prevents the occurrence of the pinhole is required and, when the film thickness is extremely large, the drive voltage of the device is increased so that the extremely large film thickness is not preferable. Consequently, the range of the film thickness of the electron transport layer is, e.g., 1 nm to 1 µm, preferably 2 nm to 500 nm, and more preferably 5 nm to 200 nm.

<Electron Injection Layer>

As a material constituting the electron injection layer, an optimum material according to the type of the light emitting layer is appropriately selected, and examples of the material include an alkali metal, an alkaline earth metal, an alloy containing one or more of the alkali metal and the alkaline earth metal, an oxide, a halide, and a carbonate of the alkali metal or the alkaline earth metal, and a mixture of these substances. Examples of the alkali metal, and the oxide, the halide, or the carbonate of the alkali metal include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline earth metal, and the oxide, the halide, and the carbonate of the alkaline earth metal include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be constituted of a laminated body obtained by laminating two or more layers, and an example of the lamination includes LiF/Ca or the like. The electron injection layer is formed by the vapor deposition method, the sputtering method, and the printing method.

The range of the film thickness of the electron injection layer is preferably about 1 nm to about 1 µm.

<Cathode>

As a material for the cathode, a material having a small work function and high electric conductivity by which electron injection into the light emitting layer is facilitated is preferable. In an organic EL device extracting light from the anode side, in order to reflect light from the light emitting layer toward the anode side using the cathode, a material having a high visible light reflectance is preferable as the material for the cathode.

For the cathode, for example, the alkali metal, the alkaline earth metal, a transition metal, and a group III-B metal can be used. Examples of the material for the cathode include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, alloys of two or more of the metals, alloys of one or more of the metals and one or more of gold, silver, platinum, copper, manganese, titanium, cobalt, nickel, tungsten, and tin, graphite, and a graphite interlayer compound. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. As the cathode, there can be used a transparent conductive electrode formed of a conductive metal oxide and a conductive organic substance. Specifically, examples of the conductive metal oxide include indium oxide, zinc oxide, tin oxide, ITO, and IZO, while examples of the conductive organic substance include polyaniline or its derivative, and polythiophene or its derivative. The cathode may be constituted of a laminated body obtained by laminating two or more layers. There are cases where the electron injection layer is used as the cathode.

The film thickness of the cathode is appropriately set in consideration of electric conductivity and durability, and the range thereof is, e.g., 10 nm to 10 µm, preferably 20 nm to 1 µm, and more preferably 50 nm to 500 nm.

Examples of a manufacturing method of the anode include the vacuum vapor deposition method, the sputtering method, and a laminating method in which a metal thin film is thermally bonded.

The organic EL device described thus far can be suitably used in a curved or planar lighting unit, in a planar light source used as, e.g., a light source for a scanner, and in a display unit.

The display unit having the organic EL device includes a segment display unit, and a dot matrix display unit. The dot matrix display unit includes an active matrix display unit and a passive matrix display unit. In the active matrix display unit and the passive matrix display unit, the organic EL device is used as a light emitting device constituting each pixel. In the segment display unit, the organic EL device is used as the light emitting device constituting each pixel or a back light, while in a liquid crystal display unit, the organic EL device is used as the back light.

EXAMPLES

Example 1

The organic EL device having the following structure was fabricated.

"glass substrate/ITO (anode)/PEDOT (hole injection layer)/blue light emitting layer/Ba/Al"

First, a glass substrate formed with an ITO film (a film thickness of about 150 nm) was prepared by the sputtering method, dried after the glass substrate was washed using an alkaline detergent and ultrapure water, and further subjected to UV-$O_3$ treatment by using a UV-$O_3$ apparatus (manufactured by Technovision, Inc., trade name: "Model 312 UV-03 cleaning system").

Subsequently, by performing spin coating using a coating liquid obtained by filtering a suspension of poly(3,4) ethylenedioxythiophene/polystyrenesulfonic acid (manufactured by HC Starck-V TECH Ltd., trade name: BaytronP TP AI 4083) through a 0.2 μm membrane filter, a thin film having a thickness of 70 nm was formed on the surface of the substrate, and was dried on a hot plate at 200° C. for 10 minutes to obtain a hole injection layer.

Next, a blue light emitting material (manufactured by Sumation Co., Ltd., trade name: Lumation BP361) which emits blue light was dissolved in xylene (solvent) to prepare a 1% by weight xylene solution. A polymerizable compound (bisphenoxyethanolfluorene diacrylate manufactured by Osaka Gas Chemical Co., trade name: BPEF-A) was dissolved in xylene (solvent) to prepare a 1% by weight xylene solution.

Then, the xylene solution in which the blue light emitting material was dissolved and the xylene solution in which the polymerizable compound was dissolved were mixed such that the weight ratio between the blue light emitting material and the polymerizable compound was 90:10 to prepare a xylene solution in which the concentration of a solid portion of the blue light emitting material and the polymerizable compound relative to the xylene solution was 1% by weight. In the following Examples and Comparative Examples, the concentration of the solid portion of the light emitting material and the polymerizable compound relative to the xylene solution used as a coating liquid was set to 1% by weight. In the case where the polymerizable compound was not added, the concentration of the light emitting material relative to the xylene solution used as the coating liquid was set to 1% by weight. Spin coating was performed using this xylene solution to form a thin film of 65 nm, and the thin film was dried by heating at 200° C. for 20 minutes in a nitrogen atmosphere to obtain a light emitting layer.

Subsequently, the substrate was loaded in a vacuum vapor deposition apparatus, about 5 nm of metal barium and then about 80 nm of aluminum were deposited as a cathode, and an organic EL device was thereby fabricated. The vapor deposition of the metals was started after the degree of vacuum reached $5 \times 10^{-5}$ Pa or less.

Example 2

An organic EL device was fabricated in the same manner as in Example 1 except that the xylene solution in which the blue light emitting material was dissolved and the xylene solution in which the polymerizable compound was dissolved, which were used in Example 1, were mixed such that the weight ratio between the blue light emitting material and the polymerizable compound was 80:20.

Example 3

An organic EL device was fabricated in the same manner as in Example 1 except that the xylene solution in which the blue light emitting material was dissolved and the xylene solution in which the polymerizable compound was dissolved, which were used in Example 1, were mixed such that the weight ratio between the blue light emitting material and the polymerizable compound was 70:30.

Comparative Example 1

An organic EL device was fabricated in the same manner as in Example 1 except that trispentaerythritol octaacrylate (manufactured by Koei Chemical Co., Ltd., trade name: TPEA) not exhibiting charge transportability was used as the polymerizable compound instead of bisphenoxyethanolfluorene diacrylate, and the weight ratio between the blue light emitting material and the polymerizable compound was set to 8:2.

Comparative Example 2

An organic EL device was fabricated in the same manner as in Example 1 except that pentaerythritol hexaacrylate (Nippon Kayaku Co., Ltd., trade mane: KAYARAD DPHA) not exhibiting charge transportability was used as the polymerizable compound instead of bisphenoxyethanolfluorene diacrylate, and the weight ratio between the blue light emitting material and the polymerizable compound was set to 8:2.

Reference Example 1

An organic EL device was fabricated in the same manner as in Example 1 except that the polymerizable compound was not added, i.e., the weight ratio between the blue light emitting material and the polymerizable compound in the xylene solution of Example 1 was set to 1:0.

Example 4

An organic EL device was fabricated in the same manner as in Example 1 except that a green light emitting material (manufactured by Sumation Co., Ltd., trade name: Lumation GP1300) which emits green light was used in the xylene solution of Example 1 instead of the blue light emitting material, and the weight ratio between the green light emitting material and the polymerizable compound was set to 9:1.

Reference Example 2

An organic EL device was fabricated in the same manner as in Example 4 except that the polymerizable compound was not added, i.e., the weight ratio between the green light emitting material and the polymerizable compound in the xylene solution of Example 4 was set to 1:0.

Example 5

An organic EL device was fabricated in the same manner as in Example 1 except that a red light emitting material (manufactured by Sumation Co., Ltd., trade name: Lumation RP158) which emits red light was used in the xylene solution of Example 1 instead of the blue light emitting material, and the weight ratio between the red light emitting material and the polymerizable compound was set to 9:1.

Reference Example 3

An organic EL device was fabricated in the same manner as in Example 5 except that the polymerizable compound was not added, i.e., the weight ratio between the red light emitting material and the polymerizable compound in the xylene solution of Example 5 was set to 1:0.

(Measurement of Film Thickness Retention Rate)

A test for evaluating properties of the polymerizable compound was performed in addition to the fabrication of the organic EL device. Under the same conditions as those when the light emitting layer was formed in the individual Examples, Comparative Examples, and Reference Examples, the light emitting layer was formed on the glass substrate.

Subsequently, xylene rinsing was performed by a method in which xylene was bulged on the substrate formed with the light emitting layer using a meniscus in a spin coater, the substrate was rotated at 2000 rpm after being left to stand for 10 seconds, and the xylene on the substrate was thereby shaken off. Film thicknesses before and after the xylene rinsing were measured using a contact stylus film thickness meter (Alpha-Step P-16+ manufactured by KLA-Tencor co., Ltd.) to calculate a film thickness retention rate. The film thickness retention rate mentioned herein was assumed to be (the film thickness of the light emitting layer after the coating liquid was coated on the surface thereof)/(the film thickness of the light emitting layer before the coating liquid was coated on the surface thereof)×100 (%).

Table 1 shows properties of the organic EL devices fabricated in Examples, Comparative Examples, and Reference Examples, and the film thickness retention rates of the light emitting layers in correspondence to Examples, Comparative Examples, and Reference Examples. The luminous efficiency mentioned herein corresponds to luminous efficiency at the time of light emission of 1000 cd/m$^2$.

method, dried after the glass substrate was washed using an alkaline detergent and ultrapure water, and further subjected to UV-O$_3$ treatment by using the UV-O$_3$ apparatus (manufactured by Technovision, Inc., trade name: "Model 312 UV-03 cleaning system").

Subsequently, by performing spin coating using a coating liquid obtained by filtering a suspension of poly(3,4)ethylenedioxythiophene/polystyrenesulfonic acid (manufactured by HC Starck-V TECH Ltd., trade name: BaytronP TP AI 4083) through a 0.2 μm membrane filter, a thin film having a thickness of 70 nm was formed on the surface of the substrate, and was dried on a hot plate at 200° C. for 10 minutes to obtain a hole injection layer.

Then, by using a high molecular weight compound 1 shown by the following synthesis example as a hole transport material, the high molecular weight compound 1 was dissolved in xylene (solvent) to prepare a 0.8% by weight xylene solution. A thin film of 15 nm was formed by performing spin coating using this xylene solution, and the thin film was dried by heating at 200° C. for 20 minutes in a nitrogen atmosphere to obtain a hole transport layer.

TABLE 1

| | | layer structure | | | | film |
|---|---|---|---|---|---|---|
| | anode | hole injection layer | light emitting layer | cathode | luminous efficiency (cd/A) | thickness retention ratio |
| Example 1 | ITO | PEDOT | blue light emitting material:BPEFA = 9:1 | Ba/Al | 5.17 | 92.4% |
| Example 2 | ITO | PEDOT | blue light emitting material:BPEFA = 8:2 | Ba/Al | 4.92 | 93.3% |
| Example 3 | ITO | PEDOT | blue light emitting material:BPEFA = 7:3 | Ba/Al | 4.89 | 90.4% |
| Comparative Example 1 | ITO | PEDOT | blue light emitting material:TPEA = 8:2 | Ba/Al | 4.43 | 48% |
| Comparative Example 2 | ITO | PEDOT | blue light emitting material:DPHA = 8:2 | Ba/Al | 4.52 | 32% |
| Reference Example 1 | ITO | PEDOT | blue light emitting material only | Ba/Al | 5.52 | unmeasurable |
| Example 4 | ITO | PEDOT | green light emitting material:BPEFA = 9:1 | Ba/Al | 9.53 | 86.3% |
| Reference Example 2 | ITO | PEDOT | green light emitting material only | Ba/Al | 10 | unmeasurable |
| Example 5 | ITO | PEDOT | red light emitting material:BPEFA = 9:1 | Ba/Al | 1.82 | 88.2% |
| Reference Example 3 | ITO | PEDOT | red light emitting material only | Ba/Al | 1.93 | unmeasurable |

As shown in Table 1, although the luminous efficiency is reduced by the addition of BPEFA as the polymerizable compound when compared with Reference Examples, the degree of the reduction is small when compared with the case where TPEA or DPHA is added as the polymerizable compound. When BPEFA is used as the polymerizable compound, the film thickness retention rate is high when compared with the case where TPEA or DPHA is used as the polymerizable compound. Consequently, by using BPEFA as the polymerizable compound, the amount of addition thereof can be suppressed, and the light emitting layer having the intended film thickness can be formed.

Example 6

An organic EL device having the following structure was fabricated. "glass substrate/ITO (anode)/PEDOT (hole injection layer)/TFB/blue light emitting layer/Ba/Al"

First, a glass substrate formed with an ITO film (a film thickness of about 150 nm) was prepared by the sputtering <Synthesis Example of High Molecular Weight Compound 1>

As compounds A and C represented by the following structural formulas (A) and (C), compounds synthesized according to a method described in the description of WO2000/046321 were used.

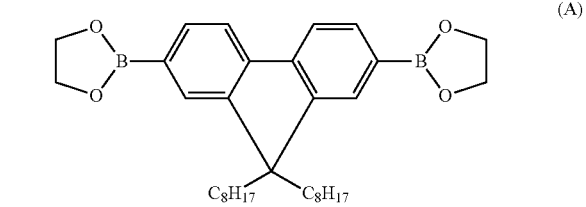

(A)

-continued

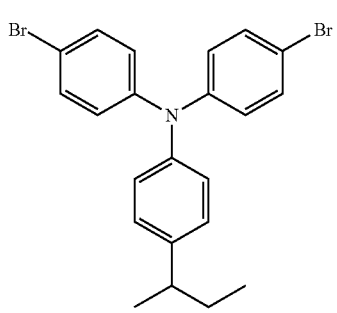

(C)

Synthesis Example 1

The high molecular weight compound 1 represented by the following formula (1) was synthesized by the following method.

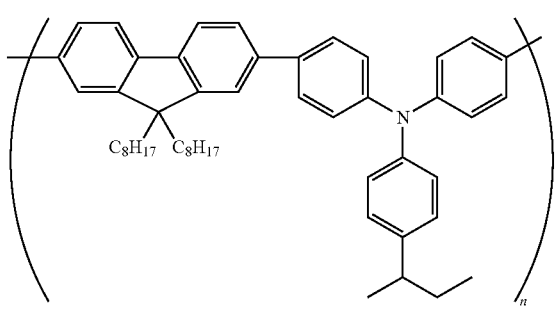

(1)

First, 0.91 g of methyltrioctylammonium chloride (manufacture by Aldrich, trade name: Aliquat 336), 5.23 g of the compound A, and 4.55 g of the compound C were charged in a 200 ml separable flask as a reaction vessel, and then the atmosphere in the reaction system was replaced with a nitrogen gas. Thereafter, 70 ml of toluene was added, and 2.0 mg of palladium acetate and 15.1 mg of tris(o-tolyl)phosphine were added. Then, a mixed solution was obtained under reflux.

Subsequently, after 19 ml of an aqueous sodium carbonate solution was dropped on the obtained mixed solution, the resultant solution was stirred overnight under reflux. Subsequently, 0.12 g of phenylboric acid was added thereto, and stirring was carried out for 7 hours. Thereafter, 300 ml of toluene was added thereto, the reaction liquid was subjected to separation, and the organic phase was washed using an aqueous acetic acid solution and water. Then, an aqueous sodium N,N-diethyldithiocarbamate solution was added, and stirring was carried out for 4 hours.

Then, after the mixed solution after being stirred was subjected to separation, the organic phase was passed through a silica gel-alumina column, washed with toluene, and dropped in methanol to precipitate a polymer. Thereafter, the obtained polymer was filtered and dried under reduced pressure, and then dissolved in toluene. Subsequently, the obtained toluene solution was dropped in methanol again to generate a precipitate, and the precipitate was filter and dried under reduced pressure to obtain 6.33 g of the high molecular weight compound 1. The polystyrene-equivalent weight average molecular weight Mw of the obtained high molecular weight compound 1 was $3.2 \times 10^5$, and the polystyrene-equivalent number average molecular weight Mn thereof was $8.8 \times 10^4$.

Next, a xylene solution in which the blue light emitting material (manufactured by Sumation Co., Ltd., trade name: Lumation BP361) which emits blue light and the polymerizable compound (bisphenoxyethanolfluorene diacrylate manufactured by Osaka Gas Chemical Co., trade name: BPEF-A) were dissolved in xylene was prepared. In the xylene solution, the concentration of the solid portion of the blue light emitting material and the polymerizable compound relative to the xylene solution was set to 1% by weight, and the weight ratio between the blue light emitting material and the polymerizable compound was set to 9:1. A thin film of 65 nm was formed by performing spin coating using this xylene solution, and the thin film was dried by heating at 200° C. for 20 minutes in a nitrogen atmosphere to obtain a light emitting layer.

Subsequently, the substrate was loaded in a vacuum vapor deposition apparatus, about 5 nm of metal barium and then about 80 nm of aluminum were deposited as a cathode, and an organic EL device was thereby fabricated. The vapor deposition of the metals was started after the degree of vacuum reached $5 \times 10^{-5}$ Pa or less.

Reference Example 4

An organic EL device was fabricated in the same manner as in Example 6 except that the polymerizable compound was not used when the organic layer and the blue light emitting layer were formed.

Table 2 shows properties of the organic EL devices fabricated in Example 6 and Reference Example 4. The luminous efficiency mentioned herein corresponds to luminous efficiency at the time of light emission of 1000 cd/m².

TABLE 2

| | layer structure | | | | luminous efficiency (cd/A) |
|---|---|---|---|---|---|
| | anode | hole injection layer | hole transport layer | light emitting layer | cathode | |
| Example 6 | ITO | PEDOT | high molecular weight compound 1 | blue light emitting material | Ba/Al | 6.3 |
| Reference Example 4 | ITO | PEDOT | high molecular weight compound 1 | blue light emitting material | Ba/Al | 6.55 |

As shown in Table 2, it was confirmed that, although the luminous efficiency was reduced by the addition of BPEFA as the polymerizable compound when compared with that in Reference Example 4, the degree of the reduction was small.

Example 7

An organic EL device shown below was fabricated.
"glass substrate/ITO (anode)/PEDOT (hole injection layer)/red light emitting layer/blue light emitting layer/Ba/Al"

First, a glass substrate formed with an ITO film (a film thickness of about 150 nm) was prepared by the sputtering method, dried after the glass substrate was washed using an alkaline detergent and ultrapure water, and further subjected to UV-O$_3$ treatment by using the UV-O$_3$ apparatus (manufactured by Technovision, Inc., trade name: "Model 312 UV-03 cleaning system").

Subsequently, by performing spin coating using a coating liquid obtained by filtering a suspension of poly(3,4)ethylenedioxythiophene/polystyrenesulfonic acid (manufactured by HC Starck-V TECH Ltd., trade name: BaytronP TP AI 4083) through a 0.2 μm membrane filter, a thin film having a thickness of 70 nm was formed on the surface of the substrate, and was dried on a hot plate at 200° C. for 10 minutes to obtain a hole injection layer.

Next, a xylene solution in which the red light emitting material (manufactured by Sumation Co., Ltd., trade name: Lumation RP158) which emits red light and the polymerizable compound (bisphenoxyethanolfluorene diacrylate manufactured by Osaka Gas Chemical Co., trade name: BPEF-A) were dissolved in xylene was prepared. In the xylene solution, the concentration of the solid portion of the red light emitting material and the polymerizable compound relative to the xylene solution was set 1% by weight, and the weight ratio between the red light emitting material and the polymerizable compound was set to 9:1. A thin film of 30 nm was formed by performing spin coating using this xylene solution, and the thin film was dried by heating at 200° C. for 20 minutes in a nitrogen atmosphere.

Subsequently, a xylene solution in which the blue light emitting material (manufactured by Sumation Co., Ltd., trade name: Lumation BP361) which emits blue light was dissolved in xylene was prepared. That is, in the present Example, a xylene solution into which the polymerizable compound was not added was prepared. The proportion of the blue light emitting material relative to the xylene solution was set to 1.0% by weight. A thin film of 65 nm was formed by performing spin coating using this xylene solution, and the thin film was dried by heating at 200° C. for 20 minutes in a nitrogen atmosphere.

Then, the substrate was loaded in a vacuum vapor deposition apparatus, about 5 nm of metal barium and then about 80 nm of aluminum were deposited as a cathode, and an organic EL device was thereby fabricated. The vapor deposition of the metals was started after the degree of vacuum reached 5×10$^{-5}$ Pa or less.

Comparative Example 3

An organic EL device was fabricated in the same manner as in Example 7 except that trispentaerythritol octaacrylate not exhibiting charge transportability was used as the polymerizable compound instead of bisphenoxyethanolfluorene diacrylate, and the weight ratio between the red light emitting material and the polymerizable compound was set to 8:2.

Comparative Example 4

An organic EL device was fabricated in the same manner as in Example 7 except that pentaerythritol hexaacrylate not exhibiting charge transportability was used as the polymerizable compound instead of bisphenoxyethanolfluorene diacrylate, and the weight ratio between the red light emitting material and the polymerizable compound was set to 8:2.

Table 3 shows properties of the organic EL devices fabricated in Comparative Examples 3 and 4. The luminous efficiency mentioned herein corresponds to luminous efficiency at the time of light emission of 1000 cd/m$^2$.

TABLE 3

| | layer structure | | | | | luminous efficiency (cd/A) |
|---|---|---|---|---|---|---|
| | anode | hole injection layer | red light emitting layer | blue light emitting layer | cathode | |
| Example 7 | ITO | PEDOT | RP158:BPEFA = 9:1 | blue light emitting material | Ba/AL | 4.23 |
| Comparative Example 3 | ITO | PEDOT | RP158:TPEA = 8:2 | blue light emitting material | Ba/AL | 3.21 |
| Comparative Example 4 | ITO | PEDOT | RP158:DPHA = 8:2 | blue light emitting material | Ba/AL | 2.69 |

As shown in Table 3, it was confirmed that the luminous efficiency was high by the addition of BPEFA as the polymerizable compound when compared with those in Comparative Examples.

Example 8

An organic EL device-shown below was fabricated.

"glass substrate/ITO (anode)/PEDOT (hole injection layer)/red light emitting layer/green light emitting layer/blue light emitting layer/Ba/Al"

First, a glass substrate formed with an ITO film (a film thickness of about 150 nm) was prepared by the sputtering method, dried after the glass substrate was washed using an alkaline detergent and ultrapure water, and further subjected to UV-O$_3$ treatment by using the UV-O$_3$ apparatus (manufactured by Technovision, Inc., trade name: "Model 312 UV-03 cleaning system").

Subsequently, by performing spin coating using a coating liquid obtained by filtering a suspension of poly(3,4)ethylenedioxythiophene/polystyrenesulfonic acid (manufactured by HC Starck-V TECH Ltd., trade name: BaytronP TP AI 4083) through a 0.2 μm membrane filter, a thin film having a thickness of 70 nm was formed on the surface of the substrate, and was dried on a hot plate at 200° C. for 10 minutes to obtain a hole injection layer.

Next, a xylene solution in which the red light emitting material (manufactured by Sumation Co., Ltd., trade name:

Lumation RP158) which emits red light and the polymerizable compound (bisphenoxyethanolfluorene diacrylate manufactured by Osaka Gas Chemical Co., trade name: BPEF-A) were dissolved in xylene was prepared. In the xylene solution, the concentration of the solid portion of the red light emitting material and the polymerizable compound relative to the xylene solution was set to 1% by weight, and the weight ratio between the red light emitting material and the polymerizable compound was set to 9:1. A thin film of 15 nm was formed by performing spin coating using this xylene solution, and the thin film was dried by heating at 200° C. for 20 minutes in a nitrogen atmosphere.

Next, a xylene solution in which the green light emitting material (manufactured by Sumation Co., Ltd., trade name: Lumation GP1300) which emits green light and the polymerizable compound (bisphenoxyethanolfluorene diacrylate manufactured by Osaka Gas Chemical Co., trade name: BPEF-A) were dissolved in xylene was prepared. In the xylene solution, the concentration of the solid portion of the green light emitting material and the polymerizable compound relative to the xylene solution was set to 1% by weight, and the weight ratio between the green light emitting material and the polymerizable compound was set to 9:1. A thin film of 20 nm was formed by performing spin coating using this xylene solution, and the thin film was dried by heating at 200° C. for 20 minutes in a nitrogen atmosphere.

Next, a xylene solution in which the blue light emitting material (manufactured by Sumation Co., Ltd., trade name: Lumation BP361) which emits blue light was dissolved in xylene was prepared. That is, in the present Example, the polymerizable compound is not added. The proportion of the blue light emitting material relative to the xylene solution was set to 1.0% by weight. A thin film of 55 nm was formed by performing spin coating using this xylene solution, and was dried by heating at 200° C. for 20 minutes in a nitrogen atmosphere.

Subsequently, the substrate was loaded in a vacuum vapor deposition apparatus, about 5 nm of metal barium and then about 80 nm of aluminum were deposited as a cathode, and an organic EL device was thereby fabricated. The vapor deposition of the metals was started after the degree of vacuum reached 5×10$^{-5}$ Pa or less.

The luminous efficiency of the fabricated device was 8.12 cd/A. The luminous efficiency mentioned herein corresponds to luminous efficiency at the time of light emission of 1000 cd/m$^2$.

Comparative Example 5

An organic EL device was fabricated in the same manner as in Example 8 except that pentaerythritol hexaacrylate not exhibiting charge transportability was used as the polymerizable compound instead of bisphenoxyethanolfluorene diacrylate, the weight ratio between the red light emitting material and the polymerizable compound was set to 8:2, and the weight ratio between the green light emitting material and the polymerizable compound was set to 8:2.

Reference Example 5

An organic EL device was fabricated in the same manner as in Example 8 except that pentaerythritol hexaacrylate not exhibiting charge transportability was used as the polymerizable compound instead of bisphenoxyethanolfluorene diacrylate, and the weight ratio between the red light emitting material and the polymerizable compound was set to 8:2.

Table 4 shows properties of the organic EL devices fabricated in Example 8, Comparative Example 5, and Reference Example 5. The luminous efficiency mentioned herein corresponds to luminous efficiency at the time of light emission of 1000 cd/m$^2$.

TABLE 4

| | | layer structure | | | | | |
|---|---|---|---|---|---|---|---|
| | anode | hole injection layer | red light emitting layer | green light emitting layer | blue light emitting layer | cathode | luminous efficiency (cd/A) |
| Example 8 | ITO | PEDOT | RP158:BPEFA = 9:1 | GP1300:BPEFA = 90:10 | blue light emitting material | Ba/Al | 8.12 |
| Comparative Example 5 | ITO | PEDOT | RP158:DPHA = 8:2 | GP1300:DPHA = 80:20 | blue light emitting material | Ba/Al | 5.33 |
| Reference Example 5 | ITO | PEDOT | RP158:DPHA = 8:2 | GP1300:BPEFA = 90:10 | blue light emitting material | Ba/Al | 6.12 |

As shown in Table 4, it was confirmed that the luminous efficiency was high by the addition of BPEFA as the polymerizable compound when compared with that in Comparative Example.

Industrial Applicability

According to an organic EL device of the present invention, by using a polymerizable compound capable of exhibiting charge transportability, degradation in properties inherent to an organic material is reduced, an intended structure is provided in the organic EL device, and easy manufacture thereof can be achieved by a coating method.

The invention claimed is:

1. An organic electroluminescent device comprising:
   a pair of electrodes; and
   a plurality of organic layers disposed between the electrodes and including an organic light emitting layer, wherein
   one of the organic layers contains an organic material forming the organic layers and a polymer comprising residues capable of exhibiting charge transportability, the polymer comprising the residues is obtained by polymerizing a polymerizable compound capable of exhibiting charge transportability, and the polymerizable compound is an aromatic compound.

2. The organic electroluminescent device of claim 1, wherein the aromatic compound is a fluorene compound.

3. The organic electroluminescent device of claim 1, wherein the ratio of amount of the polymer obtained by polymerizing the polymerizable compound relative to the total weight of the organic layers is not less than 5% by weight and less than 40% by weight.

4. The organic electroluminescent device of claim 1, wherein the polymerizable compound has at least one group selected from the group consisting of a vinyl group, an ethynyl group, a butenyl group, an acryloyl group, an acryloylamino group, a methacryloyl group, a methacryloylamino group, a vinyloxy group, a vinylamino group, a silanol group, a cyclopropyl group, a cyclobutyl group, an epoxy group, an oxetanyl group, a diketenyl group, an epithio group, a lactonyl group, and a lactamnyl group.

5. The organic electroluminescent device of claim 1, wherein the polymerizable compound is phenyl fluorene acrylate.

6. A planar unit comprising the organic electroluminescent device of claim 1.

7. A lighting unit comprising the organic electroluminescent device of claim 1.

8. A display unit comprising the organic electroluminescent device of claim 1.

9. The organic electroluminescent device of claim 1, wherein the fluorene compound has one fluorene skeleton.

* * * * *